(12) United States Patent
Chuang et al.

(10) Patent No.: US 9,002,669 B2
(45) Date of Patent: Apr. 7, 2015

(54) ELECTRICITY CONSUMPTION MEASUREMENT APPARATUS, ELECTRICITY CONSUMPTION MEASUREMENT METHOD, AND NON-TRANSITORY TANGIBLE MACHINE-READABLE MEDIUM THEREOF

(75) Inventors: Chi-Cheng Chuang, Kaohsiung (TW); Ji-Tsong Shieh, New Taipei (TW); Ray-I Chang, Taipei (TW)

(73) Assignee: Institute for Information Industry, Taipei (TW)

( * ) Notice: Subject to any disclaimer, the term of this patent is extended or adjusted under 35 U.S.C. 154(b) by 427 days.

(21) Appl. No.: 13/401,103

(22) Filed: Feb. 21, 2012

(65) Prior Publication Data
US 2013/0103331 A1     Apr. 25, 2013

(30) Foreign Application Priority Data

Oct. 25, 2011   (TW) .............................. 100138562 A

(51) Int. Cl.
| | |
|---|---|
| G06F 19/00 | (2011.01) |
| G01R 22/10 | (2006.01) |
| G06Q 50/06 | (2012.01) |
| H02J 13/00 | (2006.01) |

(52) U.S. Cl.
CPC ................ *G01R 22/10* (2013.01); *G06Q 50/06* (2013.01); *H02J 13/0006* (2013.01)

(58) Field of Classification Search
CPC ............ G06Q 50/06; G06Q 10/06; H02J 3/14
USPC .................. 702/61, 64, 66, 182–185, 188
See application file for complete search history.

(56) References Cited

U.S. PATENT DOCUMENTS

| | | | |
|---|---|---|---|
| 4,858,141 | A | 8/1989 | Hart et al. |
| 4,979,122 | A | 12/1990 | Davis et al. |
| 5,737,730 | A | 4/1998 | Alvarenga et al. |
| 5,854,995 | A | 12/1998 | Plis et al. |
| 6,629,046 | B1 | 9/2003 | Bond et al. |

(Continued)

FOREIGN PATENT DOCUMENTS

| | | |
|---|---|---|
| CN | 101915902 | 12/2010 |
| JP | 2001-312314 | 11/2001 |

OTHER PUBLICATIONS

Search Report from corresponding application DE 10 2012 203 348.3, dated Nov. 18, 2013.

(Continued)

*Primary Examiner* — Edward Raymond
(74) *Attorney, Agent, or Firm* — Greer, Burns & Crain, Ltd.

(57) ABSTRACT

An electricity consumption measurement apparatus, an electricity consumption measurement method, and a non-transitory tangible machine-readable medium thereof are provided. The electricity consumption measurement apparatus comprises a detector and a processor electrically connected to the detector. The detector is configured to detect an electricity consumption value and a voltage value. The processor is configured to calculate a variation rate according to the voltage value and a base voltage value. The processor adjusts the electricity consumption value according to the variation rate. The electricity consumption measurement method is able to perform the same operations as those performed by the electricity consumption measurement apparatus.

19 Claims, 8 Drawing Sheets

(56) References Cited

U.S. PATENT DOCUMENTS

2011/0119002 A1   5/2011  Lai et al.
2011/0121988 A1   5/2011  Chuang et al.
2011/0125703 A1   5/2011  Chuang et al.
2011/0238311 A1   9/2011  Kuhns et al.
2014/0163761 A1*  6/2014  Kuhns et al. .......... 700/295

OTHER PUBLICATIONS

Combined Search and Examination Report from corresponding application GB 1202884.1; May 28, 2012.
Office Action in Chinese Patent Application No. CN 201110411277.X by State Intellectual Property Office (SIPO) of China dated Sep. 30, 2014.

* cited by examiner

ELECTRICITY CONSUMPTION MEASUREMENT APPARATUS, ELECTRICITY CONSUMPTION MEASUREMENT METHOD, AND NON-TRANSITORY TANGIBLE MACHINE-READABLE MEDIUM THEREOF

This application claims priority to Taiwan Patent Application No. 100138562 filed on Oct. 25, 2011.

CROSS-REFERENCES TO RELATED APPLICATIONS

Not applicable.

BACKGROUND OF THE INVENTION

1. Field of the Invention

The present invention relates to an electricity consumption measurement apparatus, an electricity consumption measurement method, and a non-transitory tangible machine-readable medium thereof; more particularly, the electricity consumption measurement apparatus, the electricity consumption measurement method, and the non-transitory tangible machine-readable medium thereof provide by the present invention can adjust a detected electricity consumption value according to a voltage value.

2. Descriptions of the Related Art

To facilitate measurement and management of power consumption values of electric devices and/or electric loops, most of houses and firms are installed with electricity consumption measurement apparatuses such as electricity meters (also known as kilowatt meters). In addition to electricity consumption measurement apparatuses of the conventional mechanical type, digital electricity consumption measurement apparatuses capable of providing electricity consumption information in real time have also appeared in recent years owing to rapid development of technologies.

Electricity consumption measurement apparatuses are usually installed between an electric power supplying end and client ends to facilitate measurement of the electricity consumption values of the clients. For the client ends, users may use the electricity consumption measurement apparatuses in conjunction with an electricity usage recognition method to recognize actual electricity consumption conditions of their electric devices so as to manage their own electricity usage practices effectively. In this way, users can appropriately reduce their electricity consumption amount to promote the idea of saving energy and reducing carbon dioxide emissions.

Although the conventional electricity usage recognition technologies have already been able to recognize the electricity consumption conditions of electric devices, they still have the problem of shifting of the recognition accuracy. That is, even when the operation status of an electric device in a same electric loop remains unchanged, the recognition results obtained at different time points may still vary. As an example, for an electric device operating in an unchanged status in a same electric loop, the recognition result obtained in the morning might be different from that obtained in the afternoon.

The main cause for shifting of the recognition accuracy is the voltage variations. To be more specific, the voltage supplied by the electric power supplying end is not invariable and constant, so errors may exist in the electricity consumption values measured by the electricity consumption measurement apparatuses. Hence, the problem of shifting of the recognition accuracy occurs.

Accordingly, a solution that can measure the electricity consumption more accurately so as to provide desirable results for subsequent electricity usage recognition and other applications is in an urgent need in this filed.

SUMMARY OF THE INVENTION

To solve the aforesaid problem, the present invention provides an electricity consumption measurement apparatus, an electricity consumption measurement method, and a non-transitory tangible machine-readable medium thereof.

The electricity consumption measurement method of the present invention is adapted for use in an electricity consumption measurement apparatus. The electricity consumption measurement method comprises the following steps of: (a) enabling the electricity consumption measurement apparatus to detect an electricity consumption value; (b) enabling the electricity consumption measurement apparatus to detect a voltage value; (c) enabling the electricity consumption measurement apparatus to calculate a variation rate according to the voltage value and a base voltage value; and (d) enabling the electricity consumption measurement apparatus to adjust the electricity consumption value according to the variation rate.

The non-transitory tangible machine-readable medium of the present invention stores a computer program. The computer program is able to execute the aforesaid electricity consumption measurement method when being loaded into an electricity consumption measurement apparatus.

The electricity consumption measurement apparatus of the present invention comprises a detector and a processor electrically connected to the detector. The detector is configured to detect an electricity consumption value and a voltage value. The processor is configured to calculate a variation rate according to the voltage value and a base voltage value. The processor is further configured to adjust the electricity consumption value according to the variation rate.

The electricity consumption measurement apparatus, the electricity consumption measurement method, and the non-transitory tangible machine-readable medium thereof of the present invention adjust the detected electricity consumption value by using a detected voltage value, so the adjusted electricity consumption value can properly reflect the electricity consumption conditions of an electric device and/or an electric loop.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following description, the electricity consumption measurement apparatus, the electricity consumption measurement method and the non-transitory tangible machine-readable medium thereof of the present invention will be explained with reference to embodiments thereof. However, these embodiments are not intended to limit the present invention to any specific environment, applications or particular implementations described in these embodiments. Therefore, description of these embodiments is only for purpose of illustration rather than to limit the present invention. It should be appreciated that, in the following embodiments and the attached drawings, elements unrelated to the present invention are omitted from depiction.

Figure 1:
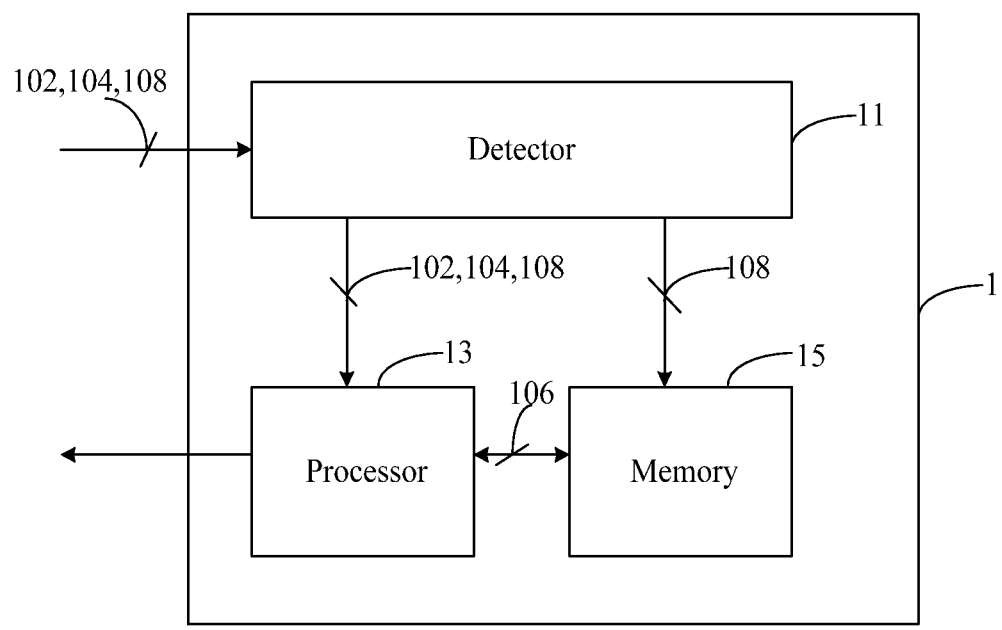
FIG. 1 is a schematic view of an electricity consumption measurement apparatus according to a first embodiment of the present invention.

A first embodiment of the present invention is an electricity consumption measurement apparatus 1, a schematic view of which is depicted in FIG. 1. The electricity consumption measurement apparatus 1 comprises a detector 11 and a processor 13 electrically connected to the detector 11. The detector 11 may be any of various detectors capable of detecting electric power information that are well-known by those of ordinary skill in the art. The processor 13 may be any of various processors, central processing units (CPUs), microprocessors, or other computing devices that are well-known by those of ordinary skill in the art.

The electricity consumption measurement apparatus 1 may be connected to a single electric device and the detector 11 can detect an electricity consumption value 102 of the single electric device in this case. The detector 11 also detects a voltage value 104. The detector 11 may detect the electricity consumption value 102 and the voltage value 104 at a same time point or at different time points. If the electricity consumption value 102 and the voltage value 104 are detected at different time points, a time difference between the time points must be smaller than a preset range so that the voltage value 104 can properly reflect the voltage level supplied by the electric power supplying end when the single electric device consumes the electricity consumption value 102.

Since the electricity consumption measurement apparatus 1 is configured to detect electricity usage conditions of the single electric device, the electricity consumption value 102 detected by the detector 11 of the electricity consumption measurement apparatus 1 may be an electric current value, an active power value, a reactive power value, an apparent power value, and/or some other information that can reflect the electricity consumption conditions.

Next, the processor 13 calculates a variation rate according to the voltage value 104 and a base voltage value 106. For example, the base voltage value 106 may be a standard voltage value. The standard voltage value is 110 volts (V) in the Republic of China (ROC), the North America and Japan, and is 220 V in the People's Republic of China (PRC) and in Europe. As another example, a plurality of reference voltage values 108 may be detected by the detector 11 within a period of time, and then the base voltage value 106 is determined by the processor 13 according to the detected reference voltage values 108. For instance, the processor 13 may take an average of these reference voltage values 108 as the base voltage value 106.

Then, the processor 13 adjusts the electricity consumption value 102 according to the variation rate. For example, the processor 13 may derive the variation rate by dividing the base voltage value 106 by the voltage value 104 and then derive the adjusted electricity consumption value 102 by multiplying the variation rate with the electricity consumption value 102. Thereby, the adjusted electricity consumption value 102 can properly reflect the actual electricity consumption amount of the single electric device.

The electricity consumption measurement apparatus 1 of the first embodiment may also be electrically connected to an electric loop. In this case, the electricity consumption measurement apparatus 1 can detect an electricity consumption value of the electric loop, and then adjust the electric consumption value in the same way as described above (i.e., calculate a variation rate according to the voltage value and the base voltage value, and then adjust the electricity consumption value according to the variation rate) so that the actual electricity consumption of the electric loop can be properly reflected.

The electricity consumption measurement apparatus 1 of the first embodiment may further comprises a memory 15, which is electrically connected to the detector 11 and the processor 13. The memory 15 may be configured to store the reference voltage values 108 and the base voltage value 106 obtained through measurement. In other embodiments, the electricity consumption measurement apparatus may not comprise a memory for storing the reference voltage values and the base voltage value; in such a case, the electricity consumption measurement apparatus may firstly detect a plurality of reference voltage values when the reference voltage values is desired and then calculate the base voltage value according to the reference voltage values. As another example, a constant base voltage value may be set in the electricity consumption measurement apparatus.

According to the above descriptions, it is learned that the electricity consumption measurement apparatus 1 of the first embodiment takes the voltage variation rate into consideration when calculating the electricity consumption value, so the detected electricity consumption value can be adjusted more effectively to properly reflect the actual electricity consumption value of the electric device/electric loop.

A second embodiment of the present invention is an electricity usage recognition system that uses the electricity consumption measurement apparatus. The operational process of the electricity usage recognition system comprises two primary stages: a learning stage and a recognition stage.

Figure 2A:
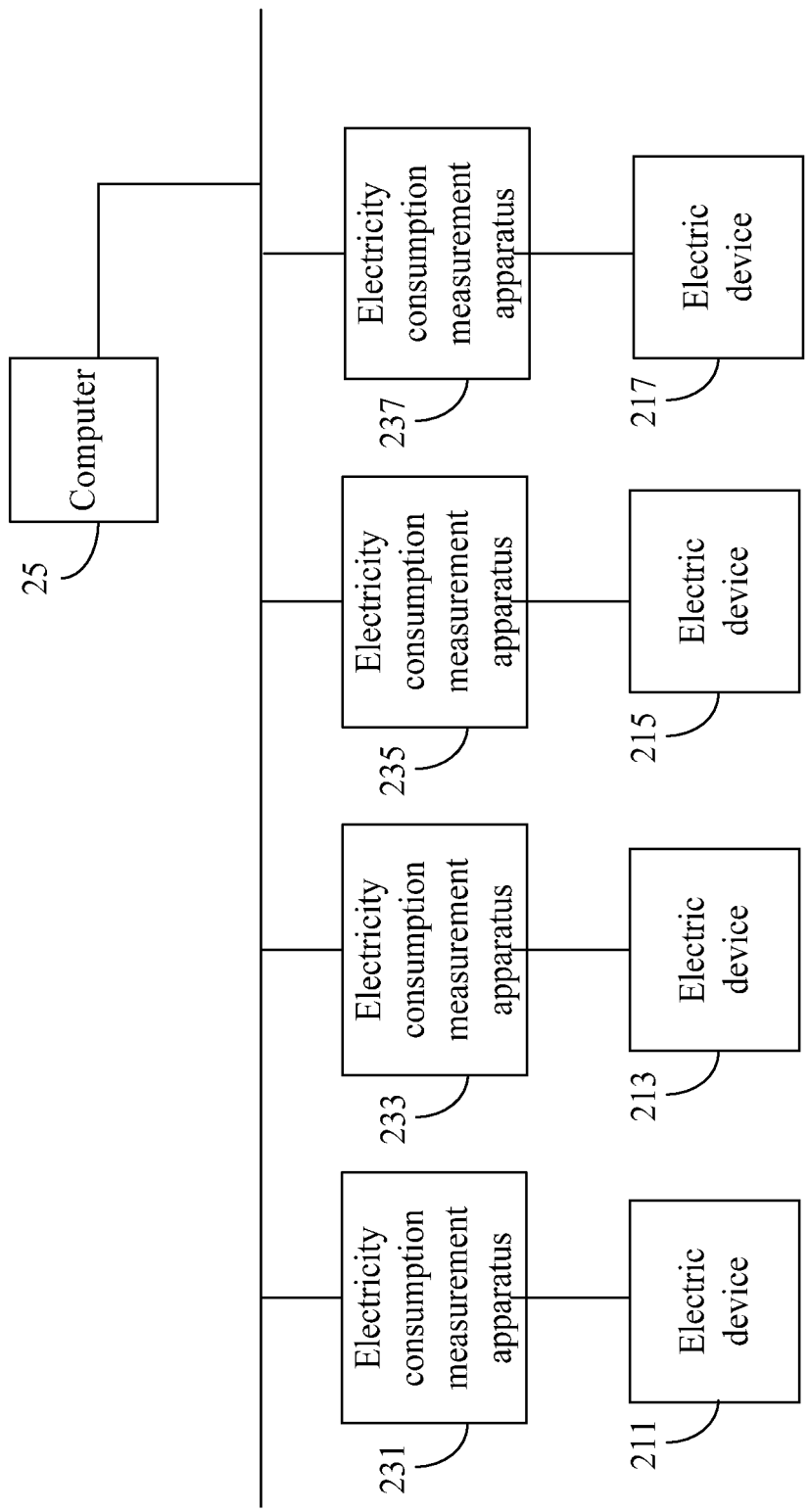
FIG. 2A is a schematic view illustrating a framework of an electricity usage recognition system in a learning stage.

FIG. 2A is a schematic view illustrating a framework of the electricity usage recognition system in the learning stage. The electricity usage environment to be recognized by the electricity usage recognition system comprises four electric devices 211, 213, 215, and 217, which are electrically connected to electricity consumption measurement apparatuses 231, 233, 235, and 237 respectively. It shall be appreciated that the number of electric devices in the electricity usage environment is not intended to limit the scope of the present invention.

The internal structures and functional operations of the electricity consumption measurement apparatuses 231, 233, 235, and 237 are all identical to those of the electricity consumption measurement apparatus 1 of the first embodiment. The electricity consumption measurement apparatuses 231, 233, 235, and 237 detect electricity usage conditions of the electric devices 211, 213, 215, and 217 at a certain status or at some statuses respectively. Since detection and adjustment performed by the electricity consumption measurement apparatuses 231, 233, 235, and 237 on the electric devices 211, 213, 215, and 217 respectively are all the same, only the electricity consumption measurement apparatus 231 and the electric device 211 will be described hereinafter.

As described above, the electricity consumption measurement apparatus 231 detects electricity usage conditions of the electric device 211 at a certain status or at some statues (i.e., detects an electricity consumption value and a voltage value within a period of time). For example, if the electric device 211 is an electric fan having three levels of wind power (i.e., a high level, a middle level, and a low level), then the electricity consumption measurement apparatus 231 will detect electricity usage conditions of the electric device 211 at these three levels respectively. As another example, if the electric device 211 only has an ON status and an OFF status, then the electricity consumption measurement apparatus 231 will detect the electricity usage conditions of the electric device 211 at the ON status. Next, for each of the statues of the electric device 211, the electricity consumption measurement apparatus 231 calculates a variation rate according to the detected voltage value and a base voltage value. Thereafter, the electricity consumption measurement apparatus 231 adjusts the measured electricity consumption value according to the variation rate.

Figure 2B:
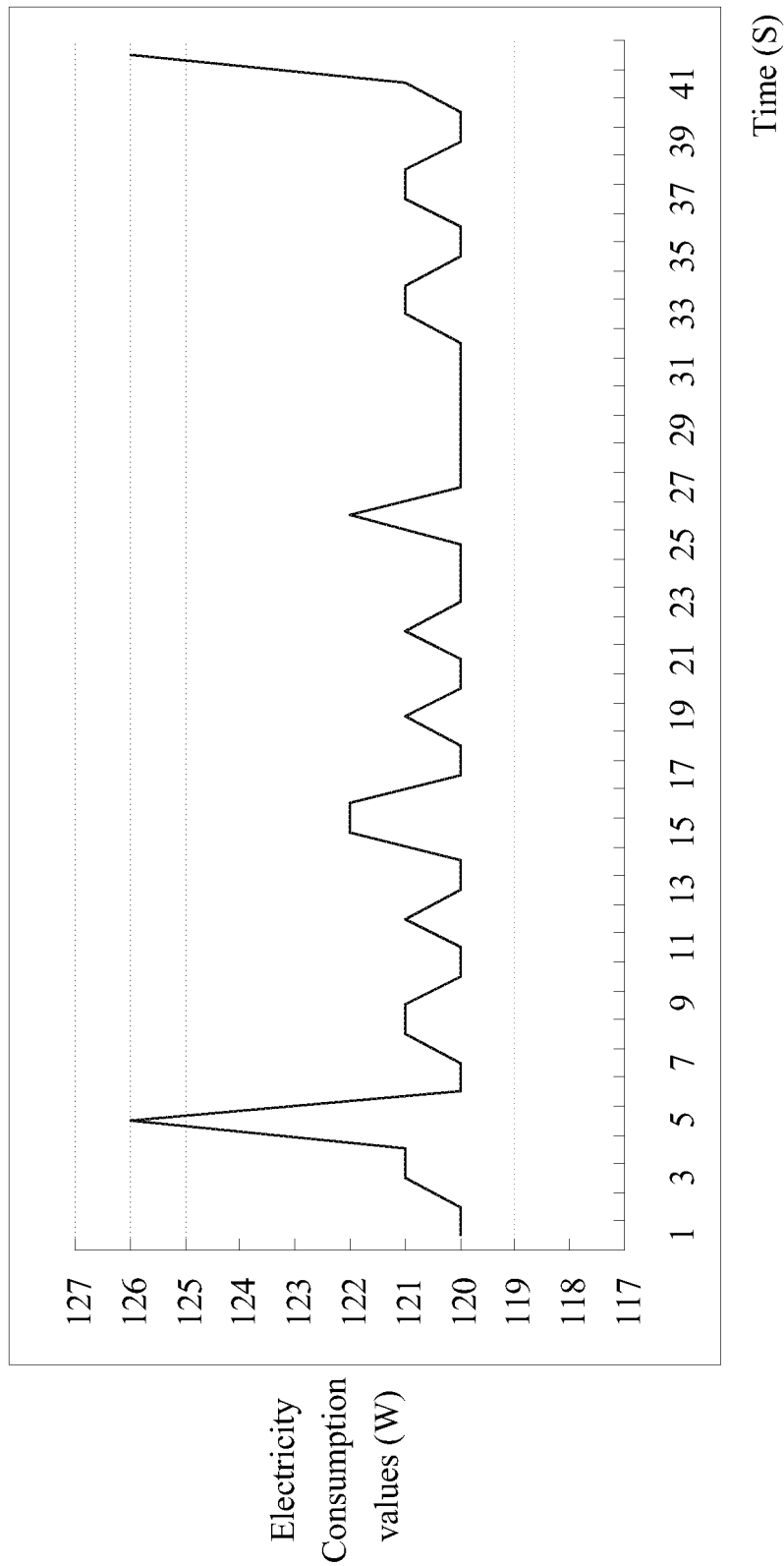
FIG. 2B depicts electricity consumption values detected by the electricity consumption measurement apparatus.
Figure 2C:
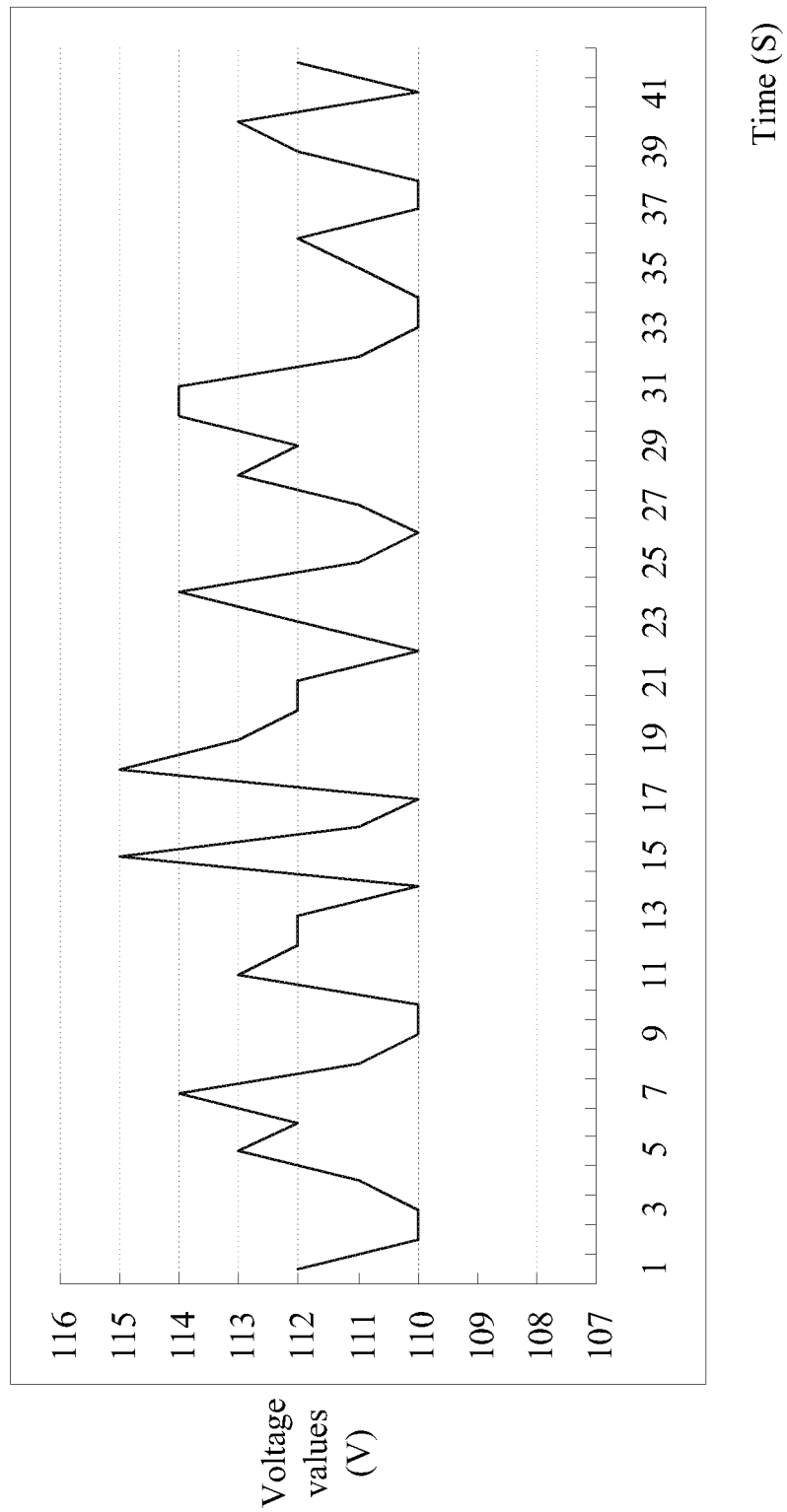
FIG. 2C depicts voltage values detected by the electricity consumption measurement apparatus.
Figure 2D:
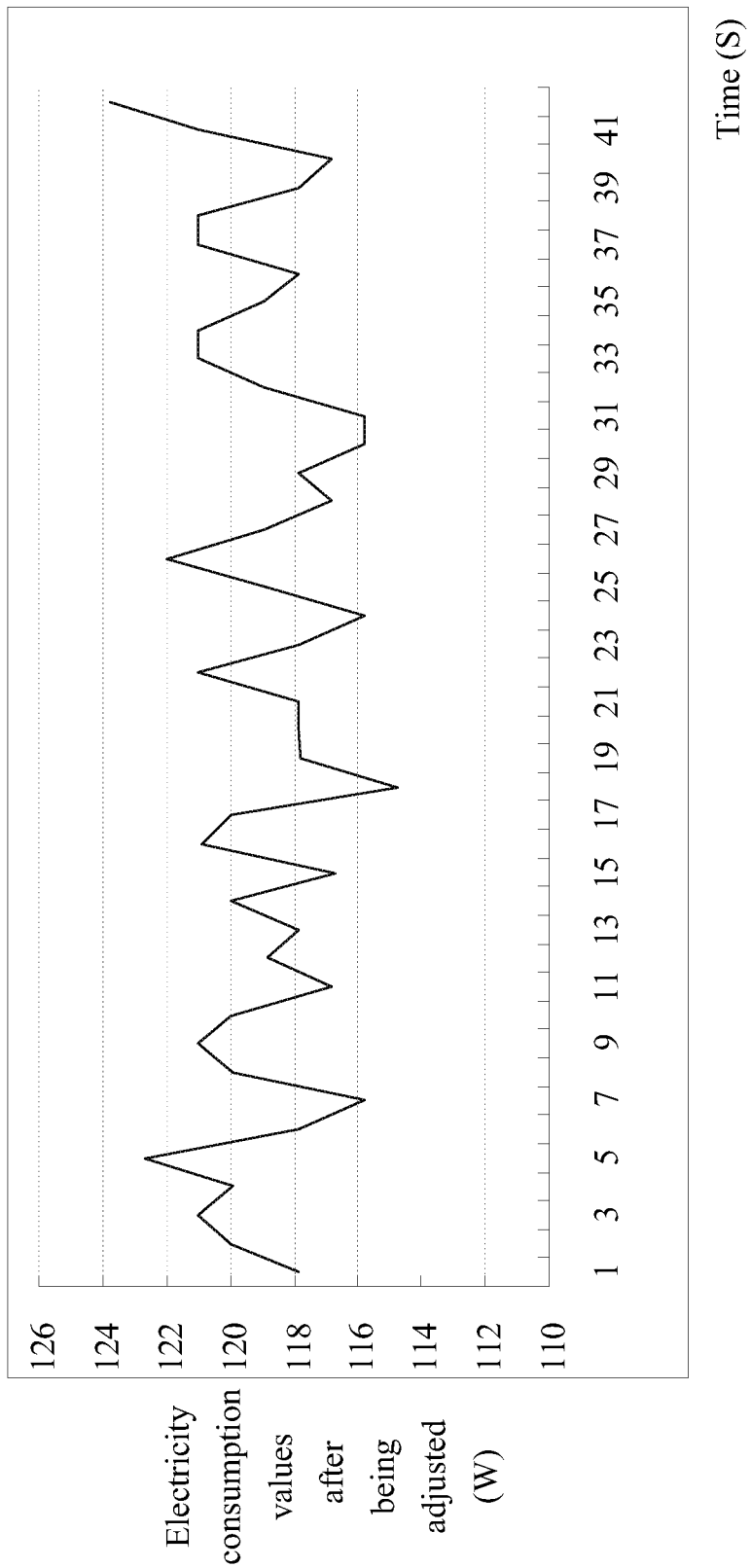
FIG. 2D depicts electricity consumption values after being adjusted.

Referring to FIG. 2B, FIG. 2C, and FIG. 2D together, an exemplary example in which the electricity consumption measurement apparatus 231 adjusts an electricity consumption value of the electric device 211 is depicted therein.

FIG. 2B depicts 42 electricity consumption values detected by the electricity consumption measurement apparatus 231 within a period of time (i.e., one electricity consumption value per second within 42 seconds), where the horizontal axis represents the time and the vertical axis represents the electricity consumption values. In this example, each electricity consumption value is an active power value.

FIG. 2C depicts 42 voltage values detected by the electricity consumption measurement apparatus 231 (i.e., one voltage value per second within 42 seconds), which correspond to the 42 electricity consumption values depicted in FIG. 2B respectively. In FIG. 2C, the horizontal axis represents the time and the vertical axis represents the voltage values. Then, the electricity consumption measurement apparatus 231 calculates a variation rate corresponding to each of the electricity consumption values and adjusts the corresponding electricity consumption value according to the variation rate. Here, the electricity consumption measurement apparatus 231 derives the variation rate by dividing the base voltage value (i.e., the standard voltage value of 110 V) by the voltage value and then derives the adjusted electricity consumption value by multiplying the variation rate with the corresponding electricity consumption value.

FIG. 2D depicts 42 electricity consumption values after being adjusted, where the horizontal axis represents the time and the vertical axis represents the adjusted electricity consumption values.

As can be seen from FIG. 2B, among the 42 electricity consumption values detected by the electricity consumption measurement apparatus 231 at the beginning, there are 25 active power values of 120 watts (W), 12 active power values of 121 W, 3 active power values of 122 W and 2 active power values of 126 W, and none of the 42 electricity consumption values corresponds to active power values of 123 W, 124 W or 125 W. As can be further seen from FIG. 2D, among the 42 electricity consumption values that have been adjusted by the electricity consumption measurement apparatus 231, there are 1 active power value of 115 W, 3 active power values of 116 W, 5 active power values of 117 W, 10 active power values of 118 W, 6 active power values of 119 W, 6 active power values of 120 W, 8 active power values of 121 W, 1 active power value of 122 W, 1 active power value of 123 W, and 1 active power value of 124 W.

After the electricity consumption measurement apparatuses 231, 233, 235, and 237 have performed the aforesaid operations on the electric devices 211, 213, 215, and 217 and obtained the adjusted electricity consumption values, a computer 25 of the electricity usage recognition system can employ any electricity usage recognition algorithm to learn electricity usage characteristics of the electric devices 211, 213, 215, and 217 according to the adjusted electricity consumption values and create an electricity consumption characteristics correspondence table for use in subsequent recognition.

It shall be appreciated that various electricity usage recognition algorithms are well known to those of ordinary skill in the art, so no further description will be made herein. It shall be also appreciated that the present invention focuses on how to adjust electricity consumption values measured on electric devices by an electricity consumption measurement apparatus so that the electricity usage recognition system can learn electricity usage characteristics of the electric devices more accurately.

Figure 2E:
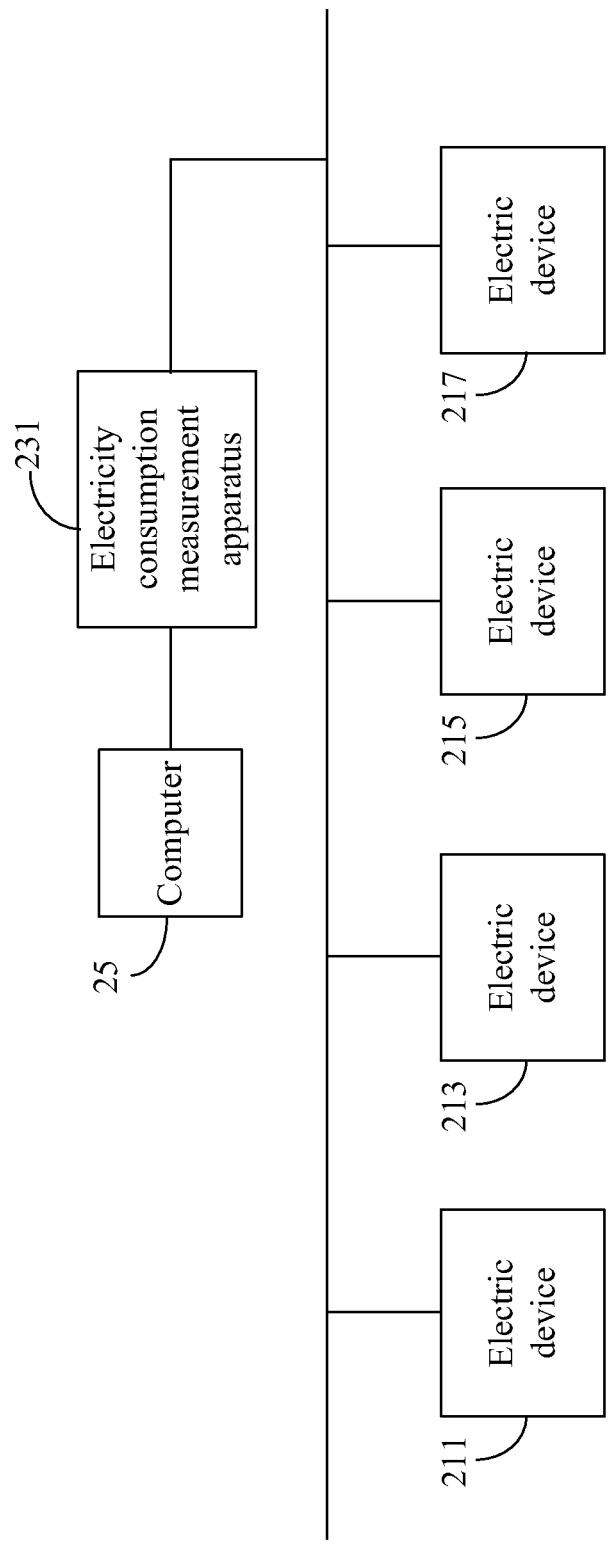
FIG. 2E is a schematic view illustrating a framework of the electricity usage recognition system in a recognizing stage.

FIG. 2E is a schematic view illustrating a framework of the electricity usage recognition system in the recognizing stage. The electricity consumption measurement apparatus 231 is electrically connected to the computer 25 and an electric loop, and there are four electric devices 211, 213, 215, and 217 in the electric loop.

In the recognizing stage, the electricity consumption measurement apparatus 231 detects an electricity consumption value and a voltage value in the electric loop. Similarly, the electricity consumption measurement apparatus 231 calculates a variation rate according to the voltage value and a base voltage value. Since the electricity consumption value detected and adjusted in the learning stage is an active power value, the electricity consumption value detected and adjusted in the recognizing stage is also an active power value.

The electricity consumption measurement apparatus 231 may set the base voltage value to be a standard voltage value of 110 V. In some other embodiments, the electricity consumption measurement apparatus 231 may also take a statistic value (e.g., an average) of voltage values previously measured in the learning stage as the base voltage value. Then, the electricity consumption measurement apparatus 231 adjusts the electricity consumption value according to the variation rate.

It is assumed that the electricity consumption value detected by the electricity consumption measurement apparatus 231 at this time is 320 W and the detected voltage value is 113 V. If the electricity consumption measurement apparatus 231 sets the base voltage value to be the standard voltage value of 110 V, the electricity consumption measurement apparatus 231 derives by dividing the base voltage value by the voltage value and derives the adjusted electricity consumption value by multiplying the variation rate with the power consumption value. In this way, the adjusted electricity consumption value is 311.5 W.

Thereafter, the computer 25 can employ any electricity usage recognition algorithm to recognize the adjusted electricity consumption value. It shall be appreciated that the present invention focuses on how to adjust electricity consumption values measured on electric devices by the electricity consumption measurement apparatus so that the electricity usage recognition system can recognize the adjust electricity consumption values more accurately.

As can be known from the above descriptions, the electricity usage recognition system of the second embodiment takes voltage values measured during operation of the electric devices into account in both the learning stage and the recognizing stage, and adjusts the electricity consumption values measured at that time according to the voltage values. Therefore, more accurate results can be obtained no matter in the learning stage or in the recognizing stage.

Figure 3:
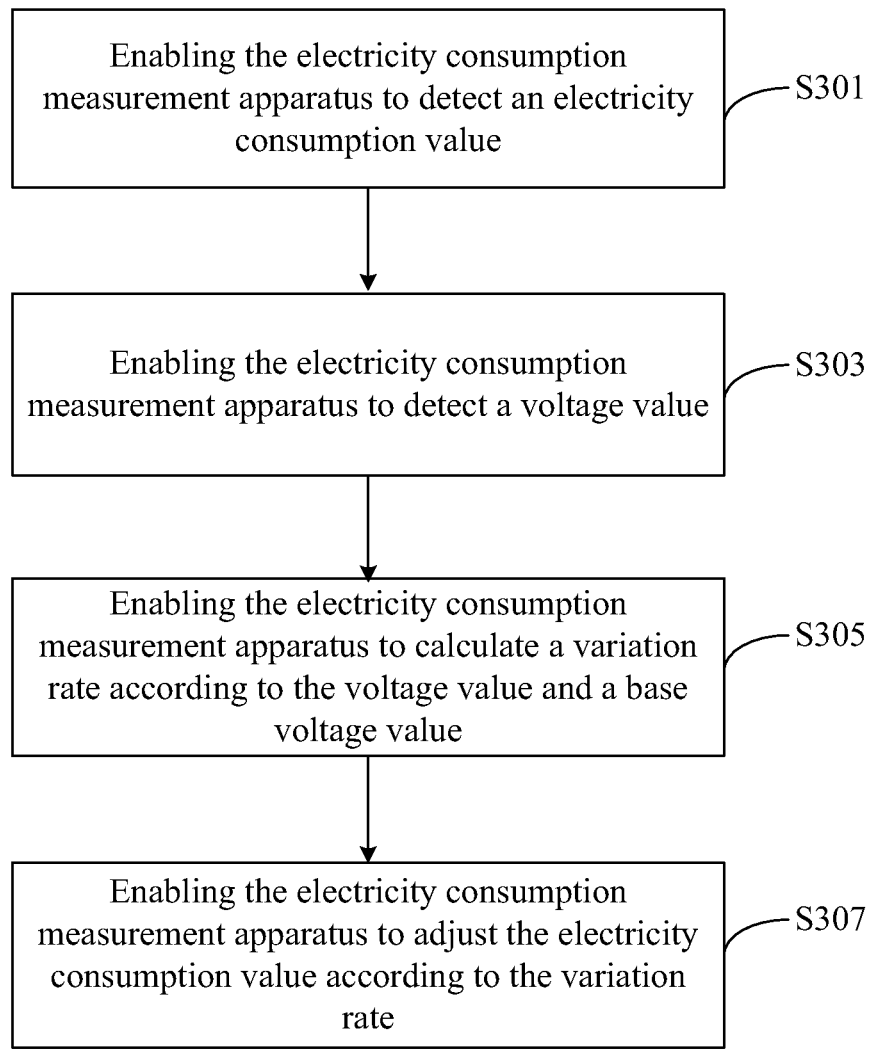
FIG. 3 is a flowchart diagram of a third embodiment of the present invention.

A third embodiment of the present invention is an electricity consumption measurement method, a flowchart diagram of which is depicted in FIG. 3. The electricity consumption measurement method is adapted for use in an electricity consumption measurement apparatus, e.g., the electricity consumption measurement apparatus 1 of the first embodiment. After the electricity consumption measurement apparatus is connected by a user to a single electric device, the electricity consumption measurement method can be executed.

Firstly, step S301 is executed to enable the electricity consumption measurement apparatus to detect an electricity consumption value of the single electric device. Then, step 303 is executed to enable the electricity consumption measurement apparatus to detect a voltage value. It shall be appreciated that the step S301 and the step S303 may be executed at a same time point or at different time points. If the step S301 and the step S303 are executed at different time points, a time difference between executions of these two steps must be smaller than a preset range so that the voltage value can properly reflect the voltage level supplied by the electric power supplying end when the single electric device consumes the electricity consumption value. Since the electricity consumption measurement method is to enable the electricity consumption measurement apparatus to detect electricity usage conditions of the single electric device, the electricity consumption value detected may be an electric current value, an active power value, a reactive power value, an apparent power value, and/or some other information that can reflect the electricity consumption conditions.

Next, step S305 is executed to enable the electricity consumption measurement apparatus to calculate a variation rate according to the voltage value detected in the step S303 and a base voltage value. The variation rate reflects a rate of shifting of the voltage level supplied by the electric power supplying end. Specifically, the voltage level supplied by the electric power supplying end is not in a constant status but may experience shifting. Therefore, voltage values detected by the electricity consumption measurement apparatus at different time points may vary from each other.

The base voltage value used in the step S305 of the electricity consumption measurement method may be a standard voltage value. The standard voltage value is 110 V in the Republic of China (ROC), the North America and Japan, and is 220 V in the People's Republic of China (PRC) and in Europe. In other embodiments, other steps may be executed to obtain the base voltage value. As an example, a plurality of reference voltage values may be detected by the electricity consumption measurement apparatus within a period of time, and then the base voltage value is determined by the electricity consumption measurement apparatus according to the reference voltage values (e.g., by taking an average of these reference voltage values as the base voltage value). In this case, the reference voltage values and the base voltage value may be further stored for subsequent use.

Finally, step S307 is executed to enable the electricity consumption measurement apparatus to adjust the electricity consumption value according to the variation rate. For example, the electricity consumption measurement method enable the electricity consumption measurement apparatus to execute step S305 to derive the variation rate by dividing the base voltage value by the voltage value detected in the step S303 and then enable the electricity consumption measurement apparatus to execute step S307 to derive the adjusted electricity consumption value by multiplying the variation rate with the electricity consumption value detected in the step S301. In this way, the adjusted electricity consumption value can properly reflect the actual electricity consumption amount of the single electric device.

If the electricity consumption measurement apparatus is electrically connected by the user to an electric loop, the electricity consumption measurement method will detect an electricity consumption value of the electric loop, and then adjust the electric consumption value in the same way as described above. Thus, no further description will be made thereon again.

In addition to the aforesaid steps, the electricity consumption measurement method of the third embodiment can also execute all the operations and functions set forth in the first embodiment. How the third embodiment executes these operations and functions will be readily appreciated by those of ordinary skill in the art based on the explanation of the first embodiment, and thus will not be further described herein.

A fourth embodiment of the present invention applies the electricity consumption measurement method to an electricity usage recognition system (e.g., the electricity usage recognition system described in the second embodiment). The electricity usage environment to be recognized by the electricity usage recognition system comprises a plurality of electric devices. The operational process of the electricity usage recognition system comprises two primary stages: a learning stage and a recognition stage. In other words, the electricity consumption measurement method will be applied to the learning stage and the recognition stage.

Figure 4:
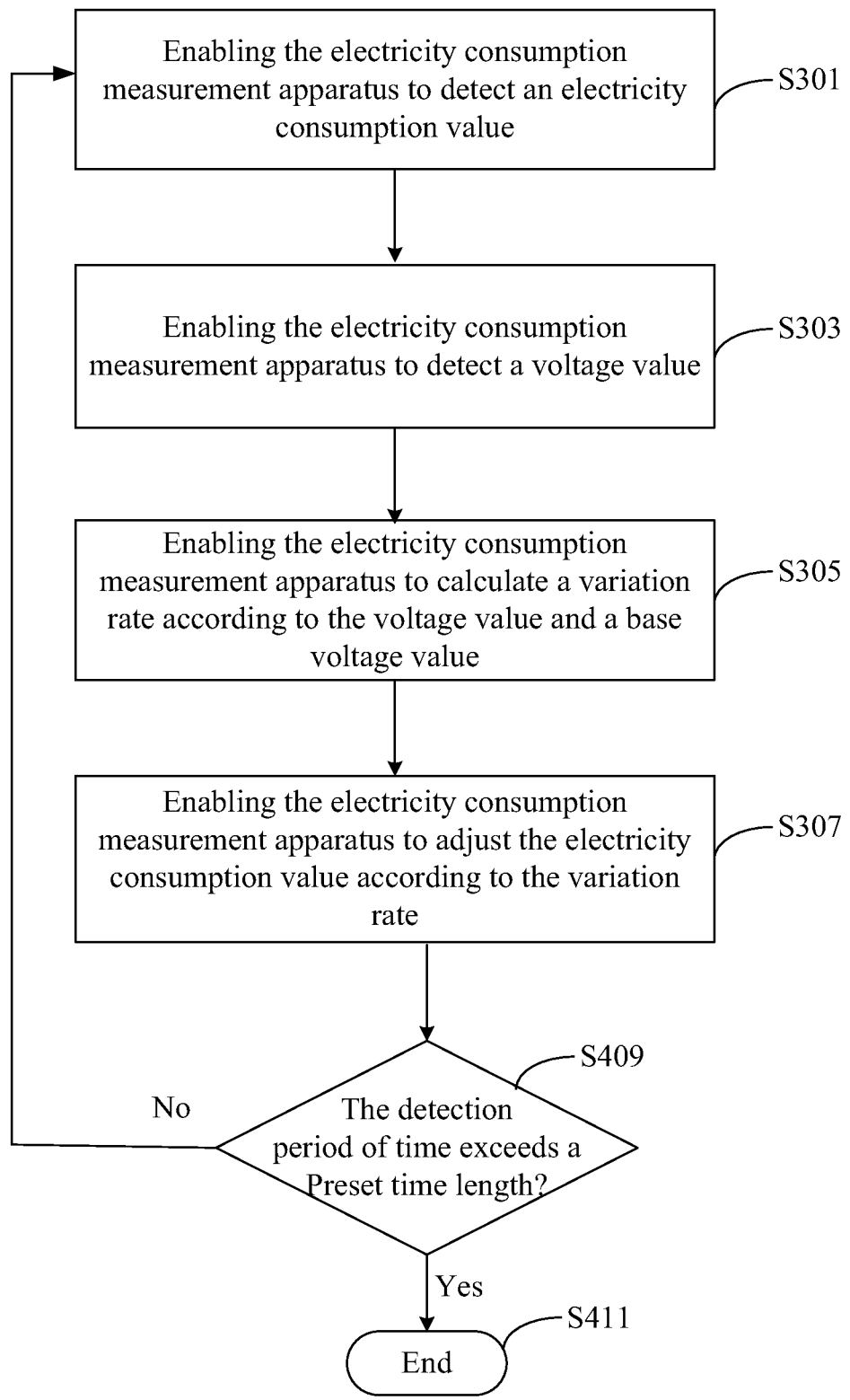
FIG. 4 is a flowchart diagram of an electricity consumption measurement method applied in the learning stage of the electricity usage recognition system.

Referring to FIG. 4, there is shown a flowchart diagram of an electricity consumption measurement method applied in the learning stage of the electricity consumption recognition system. The process flow depicted in FIG. 4 will be applied to each electric device to be recognized by the electricity usage recognition system.

For each of the electric devices, the electricity consumption measurement method detects electricity usage conditions thereof within a period of time. In particular, the electricity consumption measurement method executes the steps S301, S303, S305, and S307. As these steps have already been detailed above in the third embodiment, they will not be further described herein. Then, step S409 is executed to enable the electricity consumption measurement apparatus to determine whether the detection period of time has exceeded a preset time length. If the answer of the step S409 is "no", then the electricity consumption measurement method executes the steps S301, S303, S305, and S307 again. If the answer of the step S409 is "yes", then step S411 is executed to end the electricity usage detection on the electric device. After the electricity usage detection on all the electric devices has been completed, the electricity usage recognition system can employ any electricity usage recognition algorithm to learn electricity usage characteristics of the electric devices according to the adjusted electricity consumption values and create an electricity consumption characteristics correspondence table for use in subsequent recognition.

In the recognizing stage, the electricity consumption measurement apparatus is electrically connected to an electric loop comprising the electric devices set forth in the learning stage. The flow process depicted in FIG. 3 is adopted by the electricity usage recognition system. Specifically, steps S301 and S303 are executed to detect an electricity consumption value and a voltage value in the electric loop. Then, step S305 is executed to enable the electricity consumption measurement apparatus to calculate a variation rate according to the voltage value detected in the step S303 and a base voltage value. It shall be appreciated that the voltage value described herein may be a standard voltage value.

In the electricity consumption measurement method, a plurality of voltage values measured in the learning stage may be used as reference voltage values and the base voltage value is determined according to these reference voltage values (e.g., by taking an average of the reference voltage values as the base voltage value). Next, step S307 is executed to enable the electricity consumption measurement apparatus to adjust the electricity consumption value according to the variation rate. Finally, the electricity usage recognition system can employ any electricity usage recognition algorithm to recognize the adjusted electricity consumption value.

In addition to the aforesaid steps, the fourth embodiment can also execute all the operations and functions set forth in the second and the third embodiments. How the fourth embodiment executes these operations and functions will be readily appreciated by those of ordinary skill in the art based on the explanation of the second and the third embodiments, and thus will not be further described herein.

The electricity consumption measurement methods described in the third and the fourth embodiments may each be implemented by a non-transitory tangible machine-readable medium respectively. Each of the non-transitory tangible machine-readable media stores a computer program, and the computer program is able to execute the electricity consumption measurement method of the third or the fourth embodiment when being loaded into an electricity consumption measurement apparatus. Each of the non-transitory tangible machine-readable media may be an electronic product, such as a read only memory (ROM), a flash memory, a floppy disk, a hard disk, a compact disk (CD), a mobile disk, a magnetic tape, a database accessible to networks, or any other storage media with the same function and well known to those skilled in the art.

According to the above descriptions, the electricity consumption measurement apparatus and the electricity consumption measurement method of the present invention take the voltage variation rate into consideration and adjust the detected electricity consumption value according to the variation rate, so the adjusted electricity consumption value can properly reflect the actual electricity usage conditions of the electric device/electric loop. Thereby, the electricity consumption measurement apparatus and the electricity consumption measurement method of the present invention can provide more accurate recognition results when being used in an electricity usage recognition system.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An electricity consumption measurement method for use in an electricity consumption measurement apparatus, comprising the following steps of:
   (a) enabling the electricity consumption measurement apparatus to detect an electricity consumption value;
   (b) enabling the electricity consumption measurement apparatus to detect a voltage value;
   (c) enabling the electricity consumption measurement apparatus to calculate a variation rate according to the voltage value and a base voltage value; and
   (d) enabling the electricity consumption measurement apparatus to adjust the electricity consumption value according to the variation rate.

2. The electricity consumption measurement method of claim 1, wherein the electricity consumption value is detected on an electric device by the electricity consumption measurement apparatus in the step (a).

3. The electricity consumption measurement method of claim 1, wherein the electricity consumption value is detected on an electric loop by the electricity consumption measurement apparatus in the step (a).

4. The electricity consumption measurement method of claim 1, wherein the electricity consumption value is one of an electric current value, an active power value, a reactive power value, and an apparent power value.

5. The electricity consumption measurement method of claim 1, wherein the base voltage value is a standard voltage value.

6. The electricity consumption measurement method of claim 1, further comprising the following steps of:
   (e) enabling the electricity consumption measurement apparatus to detect a plurality of reference voltage values within a period of time; and
   (f) enabling the electricity consumption measurement apparatus to determine the base voltage value by utilizing the reference voltage values.

7. The electricity consumption measurement method of claim 6, wherein the step (f) enables the electricity consumption measurement apparatus to determine the base voltage value by averaging the reference voltage values.

8. The electricity consumption measurement method of claim 6, further comprising the following step of:
   (g) enabling the electricity consumption measurement apparatus to store the reference voltage values and the base voltage value.

9. The electricity consumption measurement method of claim 1, wherein the step (c) enables the electricity consumption measurement apparatus to calculate the variation rate by dividing the base voltage value by the voltage value, and the step (d) enables the electricity consumption measurement apparatus to adjust the electricity consumption value by multiplying the electricity consumption value with the variation rate.

10. An electricity consumption measurement apparatus, comprising:
    a detector, being configured to detect an electricity consumption value and a voltage value; and
    a processor, being electrically connected to the detector and configured to calculate a variation rate according to the voltage value and a base voltage value and adjust the electricity consumption value according to the variation rate.

11. The electricity consumption measurement apparatus of claim 10, wherein the electricity consumption value is detected on an electric device by the detector.

12. The electricity consumption measurement apparatus of claim 10, wherein the electricity consumption value is detected on an electric loop by the detector.

13. The electricity consumption measurement apparatus of claim 10, wherein the electricity consumption value is one of an electric current value, an active power value, a reactive power value, and an apparent power value.

14. The electricity consumption measurement apparatus of claim 10, wherein the base voltage value is a standard voltage value.

15. The electricity consumption measurement apparatus of claim 10, wherein the detector further detects a plurality of reference voltage values within a period of time and the processor further determines the base voltage value by utilizing the reference voltage values.

16. The electricity consumption measurement apparatus of claim 15, wherein the processor determines the base voltage value by averaging the reference voltage values.

17. The electricity consumption measurement apparatus of claim 15, comprising:
   a memory, being electrically connected to the detector and the processor and stored with the reference voltage values and the base voltage value.

18. The electricity consumption measurement apparatus of claim 10, wherein the processor calculates the variation rate by dividing the base voltage value by the voltage value and the processor adjusts the electricity consumption value by multiplying the electricity consumption value with the variation rate.

19. A non-transitory tangible machine-readable medium, being stored with a computer program, the computer program being able to execute an electricity consumption measurement method when being loaded into an electricity consumption measurement apparatus, and the electricity consumption measurement method comprising the steps of:
   (a) enabling the electricity consumption measurement apparatus to detect an electricity consumption value;
   (b) enabling the electricity consumption measurement apparatus to detect a voltage value;
   (c) enabling the electricity consumption measurement apparatus to calculate a variation rate according to the voltage value and a base voltage value; and
   (d) enabling the electricity consumption measurement apparatus to adjust the electricity consumption value according to the variation rate.

\* \* \* \* \*